US008105925B2

(12) United States Patent
Abrokwah et al.

(10) Patent No.: US 8,105,925 B2
(45) Date of Patent: Jan. 31, 2012

(54) METHOD FOR FORMING AN INSULATED GATE FIELD EFFECT DEVICE

(75) Inventors: Jonathan K. Abrokwah, Chandler, AZ (US); Ravindranath Droopad, Chandler, AZ (US); Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 213 days.

(21) Appl. No.: 12/182,349

(22) Filed: Jul. 30, 2008

(65) Prior Publication Data

US 2010/0025729 A1    Feb. 4, 2010

(51) Int. Cl.
*H01L 21/26* (2006.01)

(52) U.S. Cl. ........ 438/513; 257/192; 257/262; 257/285; 257/626; 257/E21.403; 257/E23.132; 257/E29.066; 257/E29.246; 438/285; 438/308; 438/518; 438/795; 438/796; 438/798

(58) Field of Classification Search .................. 257/192, 257/262, 285, 626, E21.403, E21.409, E23.132, 257/E29.066, E29.246; 438/285, 308, 767, 438/779, 795, 796, 798
See application file for complete search history.

(56) References Cited

U.S. PATENT DOCUMENTS

| 6,914,007 | B2 * | 7/2005 | Ma et al. .................. 438/707 |
| 2003/0137018 | A1 * | 7/2003 | Passlack et al. ............ 257/410 |
| 2006/0003595 | A1 * | 1/2006 | Passlack et al. ............ 438/758 |
| 2006/0157733 | A1 * | 7/2006 | Lucovsky et al. .......... 257/192 |
| 2007/0090405 | A1 | 4/2007 | Passlack et al. |
| 2008/0102607 | A1 | 5/2008 | Passlack et al. |

* cited by examiner

*Primary Examiner* — Hrayr A Sayadian
(74) *Attorney, Agent, or Firm* — Ingrassia Fisher & Lorenz, PC

(57) ABSTRACT

An improved insulated gate field effect device (60) is obtained by providing a substrate (20) desirably comprising a III-V semiconductor, having a further semiconductor layer (22) on the substrate (20) adapted to contain the channel (230) of the device (60) between spaced apart source-drain electrodes (421, 422) formed on the semiconductor layer (22). A dielectric layer (24) is formed on the semiconductor layer (22). A sealing layer (28) is formed on the dielectric layer (24) and exposed to an oxygen plasma (36). A gate electrode (482) is formed on the dielectric layer (24) between the source-drain electrodes (421, 422). The dielectric layer (24) preferably comprises gallium-oxide (25) and/or gadolinium-gallium oxide (26, 27), and the oxygen plasma (36) is preferably an inductively coupled plasma. A further sealing layer (44) of, for example, silicon nitride is desirably provided above the sealing layer (28). Surface states and gate dielectric traps that otherwise adversely affect leakage and channel sheet resistance are much reduced.

16 Claims, 4 Drawing Sheets

METHOD FOR FORMING AN INSULATED GATE FIELD EFFECT DEVICE

FIELD OF THE INVENTION

The present invention generally relates to semiconductor (SC) devices and integrated circuits (ICs) and, more particularly, structures and methods for forming field effect transistors (FETs), especially insulated gate field effect transistors (IGFETs), and other FET devices embodying III-V compounds and other mixed semiconductors.

BACKGROUND OF THE INVENTION

III-V semiconductor compounds and other mixed semiconductors, as opposed to type IV semiconductors such as silicon, often lack a stable passivating oxide. As a consequence, it is often difficult to build reliable and stable insulated gate field effect transistors (IGFETs) and other devices employing insulated gate electrodes because of instabilities associated with the semiconductor surface and/or the dielectrics used for the insulated gates. This problem is observed for GaAs devices employing gallates such as gadolinium oxides, gallium oxides, and combinations thereof, for the gate dielectric and surface passivation. For example, gallium oxide has been shown to exhibit a low interfacial density and to unpin the Fermi level on GaAs, and high transconductance transistors have been demonstrated with gadolinium gallium oxide/gallium oxide insulated gate dielectric. However, such devices can exhibit undesirably high series ON-resistance, partly due to high sheet resistance e.g., equal or greater than ~500 Ohms per square, for example, resulting from bulk dielectric charge trapping that can effectively immobilize or reduce the number mobile carriers available in the channel of the device for forward conduction. Charge trapping in the insulating dielectric can be time dependent so that initial high device performance can degrade over time. Even though various surface treatments have been developed to ameliorate such problems, the improvements are usually not as large as desired and/or the improvements are only temporary and the devices often revert, for example, to their pre-treatment conditions of undesirably high sheet resistance. Thus, a need continues to exist for improved structures and methods for non-type IV insulated gate field effect devices, especially those employing GaAs and other III-V binary or ternary semiconductor compounds and gallate insulating gate dielectric layers, that provide stable and long-lasting reduction in the source-drain and/or substrate leakage and/or that lower the device sheet resistance.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
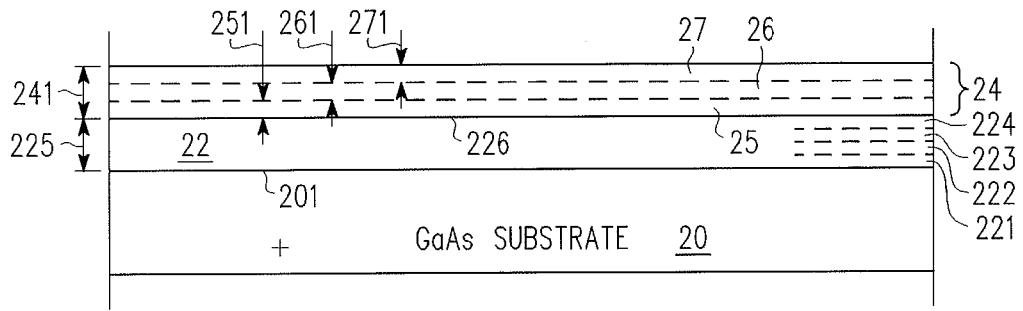
FIGS. 1-8 are simplified schematic cross-sectional views of an insulated gate field effect transistor at different stages of manufacture according to embodiments of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the abbreviation IGFET stands for insulated gate field effect transistor and any other device employing an insulated gate, and the abbreviation MOSFET stands for metal-oxide-semiconductor field effect transistor and any other device employing an insulated gate, and is intended to include structures and process wherein the gate dielectric is formed in whole or part from other than an oxide and the gate and/or other electrodes are formed in whole or part from conductors other than a metal. This broader interpretation of such terms is well known in the art. Further, as used herein, the term "semiconductor" is intended to include any semiconductor, especially non-type IV compound semiconductors, organic semiconductors and inorganic semiconductors, and the terms "substrate" and "semiconductor substrate" are intended to include single crystal structures, polycrystalline structures, thin film structures, layered structures as for example and not intended to be limiting semiconductor-on-insulator (SOI) structures, and combinations thereof. The term "semiconductor" is abbreviated as "SC."

For convenience of explanation and not intended to be limiting, the semiconductor devices and methods of fabrication are described herein for GaAs semiconductors and other binary and ternary III-V compounds, but persons of skill in the art will understand that other semiconductor materials can also be used, especially non-type IV semiconductors. Further, even though the present invention is illustrated for the case of an IGFET, those of skill in the art will understand that the present invention applies to any type of device employing an insulated gate. Non limiting examples of such materials and structures are III-V MOSFETs, diodes, Field Plated FETs, and memory devices. Polycrystalline materials are abbreviated as "poly" and polycrystalline semiconductors are abbreviated as "poly SC".

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second opposite conductivity type", where the first conductivity type may be either N or P type and the second opposite conductivity type is then either P or N type, and so forth.

FIGS. 1-8 are simplified schematic cross-sectional views of insulated gate field effect transistor or device 60 at different stages 101-108 of manufacture according to embodiments of the present invention. Referring now to manufacturing stage 101 of FIG. 1, semiconductor (SC) substrate 20 of, for example and not intended to be limiting, gallium-arsenide (GaAs) having upper surface 201, is provided. Epitaxial semiconductor (SC) hetero-structure 22 of thickness 225 is desirably formed on surface 201. By way of example and not intended to be limiting, epitaxial SC hetero-structure 22 can, in a first embodiment, comprise one or more layers such as: layer 221 of AlAs/GaAs or AlGaAs, layer 222 of $In_yGa_{(1-y)}As$, layer 223 of $Al_xGa_{(1-x)}As$, and layer 224 of GaAs. Other combinations of binary and/or ternary semiconductor compounds are also useful and intended to be included in the general terms "SC hetero-structure" and "SC hetero-structure" 22. Molecular beam epitaxy (MBE) is a preferred method of forming SC hetero-structure 22, but other methods may also be used. Thickness 225 of SC hetero-structure 22 is usefully in the range of about 100 to 300 nanometers, conveniently in the range of about 150 to 300 nanometers and preferably in the range of about 250 to 300 nanometers, but thicker or thinner layers may also be used.

Insulating dielectric layer 24 of thickness 241 overlies epitaxial SC hetero-structure 22 and eventually forms the gate dielectric of device 60. Layer 24 is preferably formed of a combination (e.g. a stack) of gallium oxide and one or more gallate dielectric insulators. As used herein, the term "gallate" is intended to include dielectrics formed from gallium oxide, gadolinium oxides and combinations thereof, or combination of at least gallium oxide with other rare earth dielectric oxides. Thickness 241 is usefully in the range of about 5 to 30 nanometers, conveniently in the range of about 10 to 30 nanometers and preferably in the range of about 10 to 20 nanometers, but thicker or thinner layers may also be used. In a preferred embodiment, layer 24 comprises two layers having first insulating dielectric 25 of thickness 251 adjacent SC hetero-structure 22 and second insulating dielectric 26 of thickness 261. First dielectric 25, for example and not intended to be limiting, preferably comprises $Ga_2O_3$, referred to for convenience of description as "GO" layer 25. Second dielectric 26, for example and not intended to be limiting, preferably comprises gadolinium-gallium oxide, referred to for convenience of description as "GGO" layer 26. Thickness 251 of $Ga_2O_3$ layer 25 is usefully in the range of about 0.2 to 1.0 nanometer, conveniently in the range of about 0.5 to 1.0 nanometer and preferably about 1.0 nanometer, but thicker or thinner layers may also be used. Thickness 261 of GGO layer 26 is usefully in the range of about 5 to 30 nanometers, conveniently in the range of about 10 to 30 nanometers and preferably in the range of about 10 to 20 nanometers, but thicker or thinner layers may also be used. In other embodiments, additional dielectric layer 27 of thickness 271 may also be included and is shown in the various figures by way of example. In the preferred embodiment, layer 27 is omitted. Structure 201 results.

Figure 2:
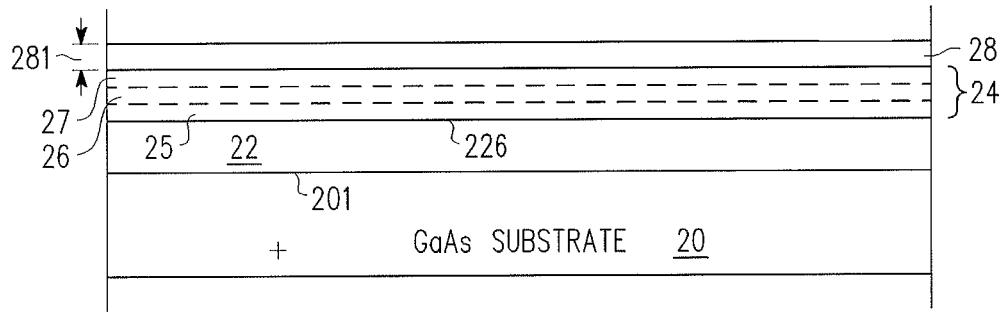

Referring now to manufacturing stage 102 of FIG. 2, further dielectric layer 28 of thickness 281 is formed on dielectric layer 24. Layer 28 is conveniently of nitride formed at comparatively low temperatures, as for example, usefully at temperatures in the range of about 30 to 200 degrees Celsius, more conveniently in the range of about 50 to 150 degrees Celsius and preferably at about 50 to 75 degrees Celsius. Stated another way, it is preferable that the temperature of substrate 20 during deposition of layer 24 usefully not exceed about 200 degrees Celsius, more preferably not to exceed about 150 degrees Celsius and preferably less than about 75 degrees Celsius. Silicon nitride is preferred for layer 28 but other dielectric materials may also be used. A non-limiting example is silicon oxi-nitride, abbreviated as "SiON." Layer 28 is preferably deposited using an Inductively Coupled Plasma (ICP) or by Plasma Enhanced Chemical Vapor deposition (PECVD), but other deposition techniques well known in the art may also be used. Structure 202 results.

Figure 3:
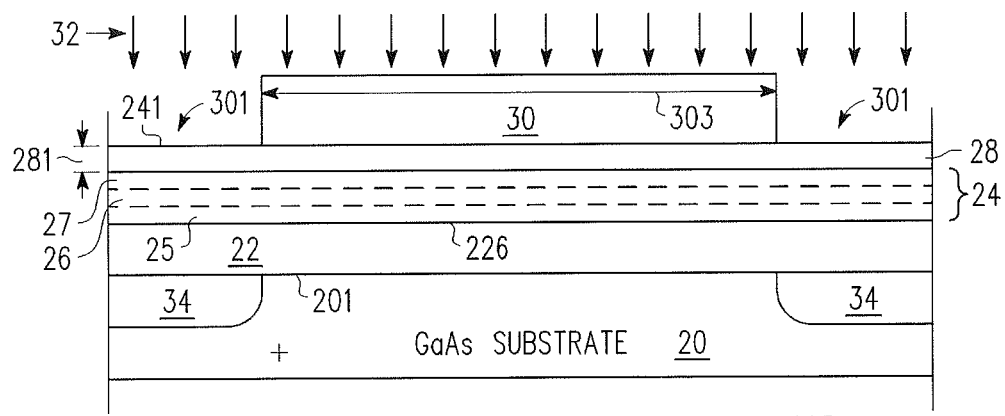

Referring now to manufacturing stage 103 of FIG. 3, mask 30, of for example photoresist, is applied above layer 28 and patterned to provide openings 301 spaced apart by distance 303. High energy implant 32 of oxygen is conveniently used to form substantially insulating regions 34 in substrate 20 spaced apart by approximately distance 303 beneath SC hetero-structure 22. Insulating regions 34 are intended to electrically separate device 60 from other nearby devices (not shown). The energy of implant 32 is chosen, depending on the thickness and mass density of layers 28, 24, 22 overlying substrate 20 so that the bulk of the implanted oxygen substantially penetrates these layers and encompasses the interface between substrate 20 and hetero-structure 22. Multiple energies may be used to adjust the depth of penetration of the implant. Structure 203 results. Oxygen implant manufacturing stage 103 is desirable but may be omitted in other embodiments when insulating regions 34 are not desired.

Figure 4:
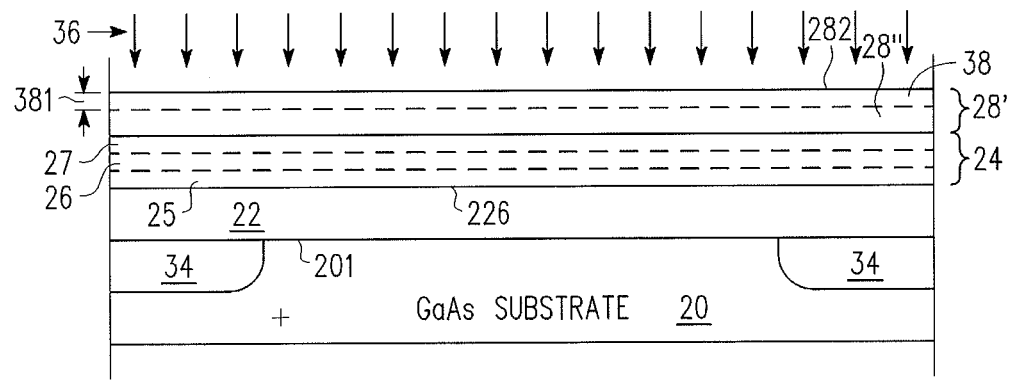

Referring now to manufacturing stage 104 of FIG. 4, photoresist mask 30 is removed. In a preferred embodiment, SiN layer 28 of structure 203 is etched off using a $CF_4/O_2$ low damage plasma process, and fresh low temperature SiN layer 28' is re-deposited. This is to avoid any random damage to nitride layer 28 that might have been introduced during oxygen implant 32 in manufacturing stage 103. Typical etching conditions are: plasma power of about 15 watts at a pressure of about 50 to 100 milli-Torr. Surface 282 of layer 28' (or surface 282 of layer 28 if left in place in other embodiments) is then exposed to oxygen plasma 36. Oxygen plasma 36 is conveniently an RF plasma, and preferably an oxygen plasma formed by inductive coupling. By way of example and not intended to be limiting, exposure to an inductively coupled oxygen plasma operating at 13.6 MHz with a power level of about 500 to 900 Watts at a pressure of about 50 to 120 Torr for about 30 to 60 seconds is suitable, but other frequencies, power levels, pressures and times may also be used. Substrate 20 is unbiased with respect to the plasma during this treatment so as to avoid significantly sputtering surface 282 of layer 28, 28'. (The designation "layer 28, 28'" is intended to refer to either layer 28 or layer 28'.) The effect of exposing surface 282 of layer 28, 28' to oxygen plasma 36 is to provide oxygen rich layer 38 of approximate thickness 381 in nitride containing layer 28, 28' beneath surface 282 and above remaining portion 28'' of nitride containing layer 28, 28'. Structure 204 results. It is found that this oxygen plasma treatment beneficially affects underlying gallate containing dielectric layer 24 and/or SC surface 226, so that the amount of undesirable surface states at SC surface 226 and/or the amount of trapped charge in dielectric layer 24 are much reduced or at least compensated. This is highly desirable since such surface states and/or trapped charge are believed to be responsible for high sheet resistance often encountered in present day GaAs based devices as noted earlier. Alternatively, in other embodiments, layer 28 may be formed in manufacturing stage 102 so as to have an oxygen rich (e.g., SiON) surface layer and the plasma exposure step of stage 104 omitted.

Figure 5:
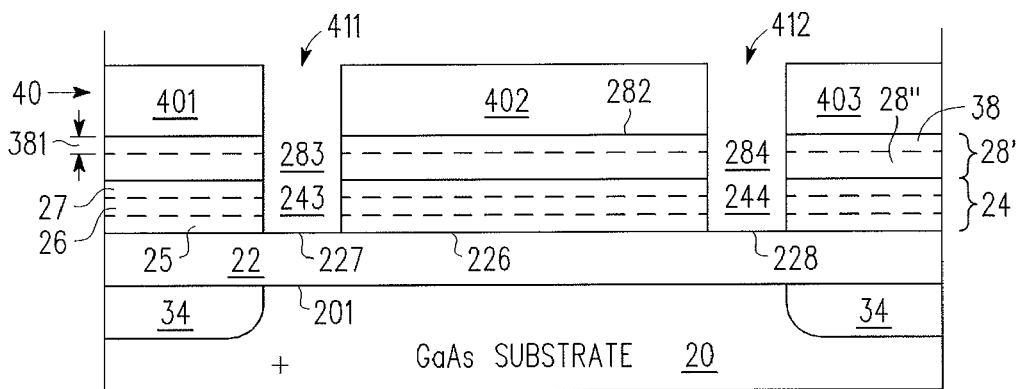

Referring now to manufacturing stage 105 of FIG. 5, mask 40 of, for example, photoresist is applied to surface 282 and trenches or openings 411, 412 are provided in mask 40 between mask segments 401, 402, 403. Portions 283, 284 of nitride layer 28, 28' and portions 243, 244 of dielectric layer 24 exposed in openings 411, 412 are etched away so as to expose underlying portions 227, 228 of SC surface 226 of hetero-structure 22. A low damage $CF_4/O_2$ plasma etch is preferred for etching nitride containing layer 28, 28' but other etching means may also be employed. Typical etching conditions are plasma power of about 15 watts at a pressure of about 50 to 100 milli-Torr. A wet etch using, for example dilute HCl, is preferred for etching GO/GGO dielectric stack layer 24 but other reagents adapted to provide a low damage etch of the materials of dielectric layer 24 may also be used. Structure 205 results.

Figure 6:
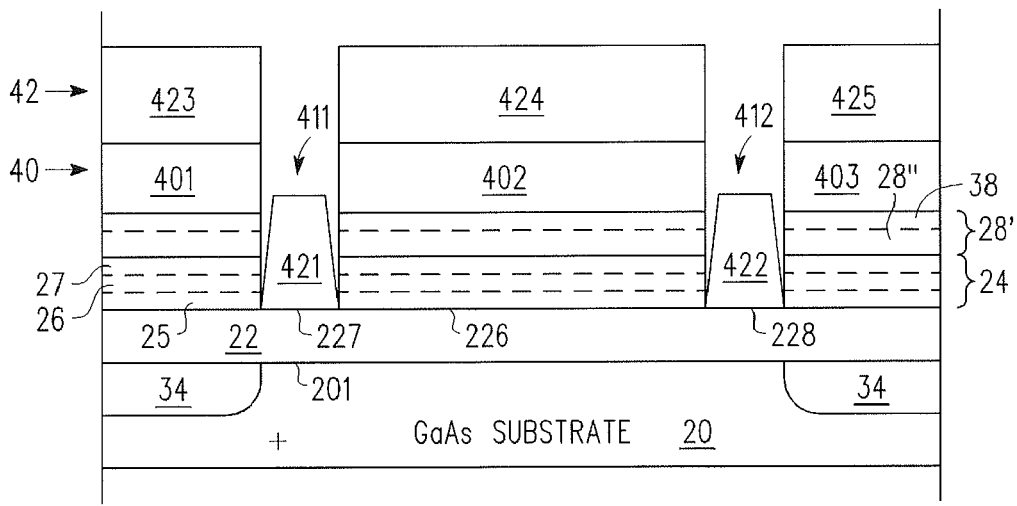

Referring now to manufacturing stage 106 of FIG. 6, conductor 42 is applied over mask 40 and in openings 411, 413. Conductor portions 423-425 of conductor 42 lie atop mask portions 401-403 and conductor portions 421, 422 are formed on portions 227, 228 of surface 226 of SC hetero structure 22 in openings 411, 412, where they are adapted to make ohmic contact to the material of SC hetero-structure 22. Conductor portions 421, 422 form, for example, the source-drain electrodes of IGFET device 60. NiGeAu is preferred for conductor 42, but other metals, semi-metals, doped semiconductors and/or alloys or combinations thereof may also be used. Structure 206 results.

Figure 7:
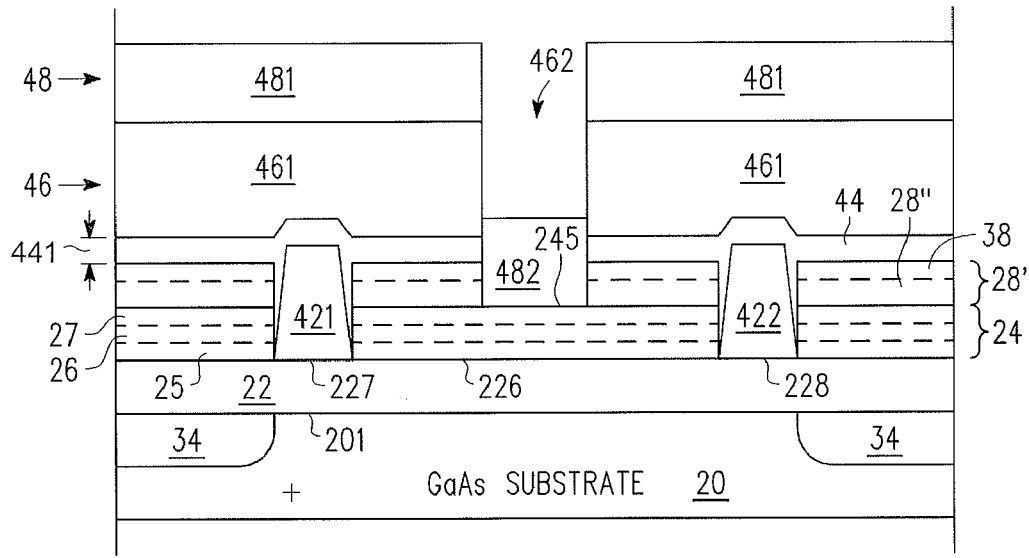

Referring now to manufacturing stage 107 of FIG. 7, photoresist mask 40 is removed, using for example a standard resist strip, thereby lifting off portions 423-425 of conductor 42 and leaving behind source-drain contacts 421-422. A rapid thermal anneal cycle of, for example and not intended to be limiting, heating substrate 20 to a temperature in the range of about 430 to 440 degrees Celsius for about 30 to 60 seconds in $N_2$ or other substantially inert atmosphere is desirably provided, but other thermal treatments may also be used. This annealing cycle is desirable to facilitate metal regions 421, 422 making ohmic contact to regions 227, 228 of surface 226 of SC hetero-structure 22, and also to activate oxygen isolation implant regions 34 provided in manufacturing stage 103. Further sealing layer 44 having thickness 441, for example comprising a nitride, is formed over structure 206 of FIG. 6 after resist mask 40 and conductor portions 423-425 have been removed. Silicon nitride is preferred for layer 44 but other sealing dielectrics may also be used. A non-limiting example is silicon oxi-nitride. Mask 46 is then applied and opening 462 formed therein between mask portions 461. Opening 462 is conveniently located approximately centrally between source-drain contacts 421-422, but other locations are also useful. Layer 28, 28' is etched in opening 462 to expose portion 245 of dielectric layer 24 beneath opening 462. A low damage $CF_4/O_2$ plasma etch is preferred for etching nitride layer 28, 28' in substantially the same way as utilized in etching layer 28, 28' in connection with manufacturing stage 105 of FIG. 5. Conductor 48 is then deposited, for example and not intended to be limiting, by electron beam evaporation, thereby forming conductor portions 481 on mask portions 461 and conductor portion 482 contacting portion 245 of dielectric layer 24 in opening 462. Conductor portion 482 forms the gate of IGFET device 60. Conductor 48 is preferably Pt or other high work function conductor (e.g. a metal) relative to GaAs, and has a thickness of at least 50 to 100 nanometers. Additional metallization, for example about 200-300 nanometers of Au (not shown), may be deposited on the Pt to reduce the gate resistance. Structure 207 results.

Figure 8:
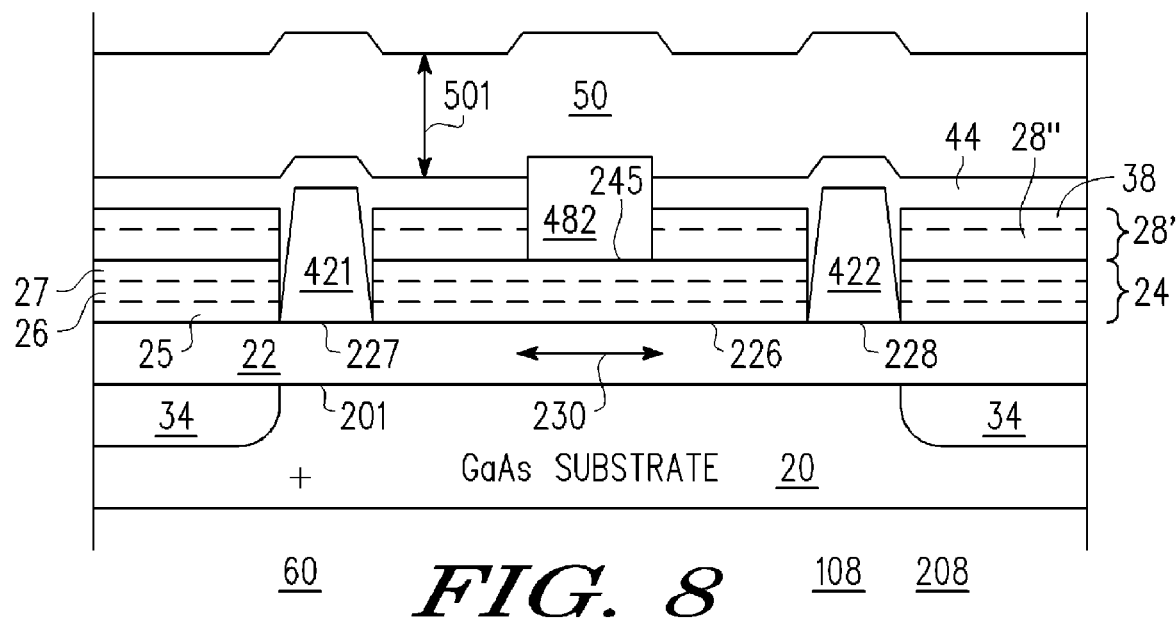

Referring now to manufacturing stage 108 of FIG. 8, photoresist mask 46 is removed, using for example a standard resist strip, thereby lifting off portions 481 of conductor 48 and leaving behind gate 482. A further thermal anneal cycle is desirably performed, as for example and not intended to be limiting, by exposing substrate 20 to temperatures in the range of about 200 to 350 degrees Celsius for about 20 to 30 seconds in an inert atmosphere such as argon, but other annealing conditions can also be used. The purpose of this further anneal is to promote good adhesion and intimate contact of the Pt to the oxide gate dielectric. Dielectric layer 50 of thickness 501 is then desirably deposited over device 60 to provide further surface passivation and still further sealing against environmental influences. Silicon nitride is useful for layer 50 but other dielectrics well known in the art may also be used. The material of layer 50 may be formed by plasma enhanced chemical vapor deposition (PECVD). Deposition temperatures in the range of about 150 to 300 degrees Celsius are useful, more conveniently about in the range 150 to 200 degrees Celsius and preferably about in the range of 130 to 170 degrees Celsius. Thickness 501 of layer 50 is usefully in the range of about 100 to 300 nanometers, conveniently about 200 to 300 nanometers and preferably about 200 nanometers. Other dielectric materials, formation temperatures and thicknesses may also be used. Structure 208 comprising device 60 results.

Figure 9:
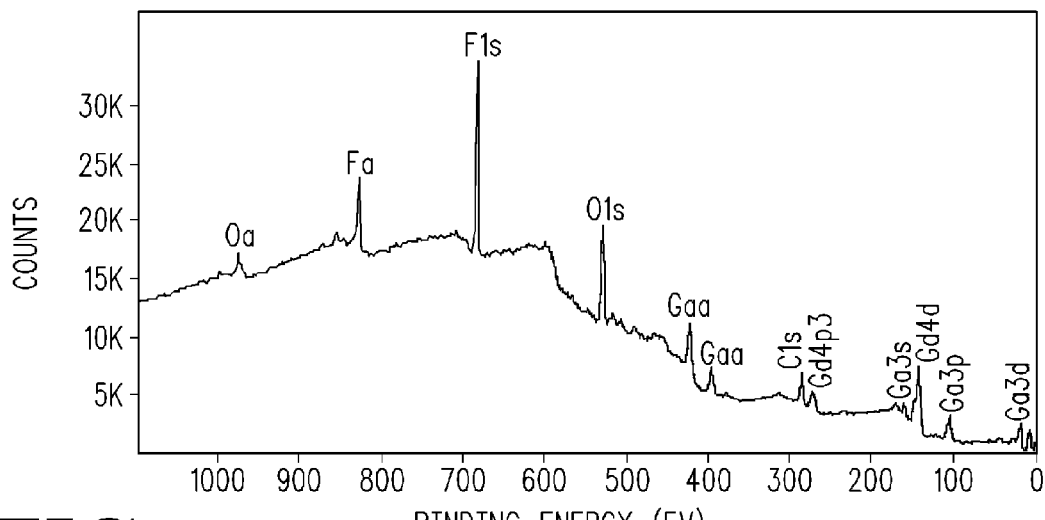
FIGS. 9-11 are plots of X-ray Photoelectron Spectroscopy (XPS) data of gadolinium gallium oxide (GGO) surface passivation and gate dielectric at various steps in the manufacturing process showing how various treatments according to embodiments of the present invention can reduce contamination in the oxide passivation and gate dielectric.
Figure 10:
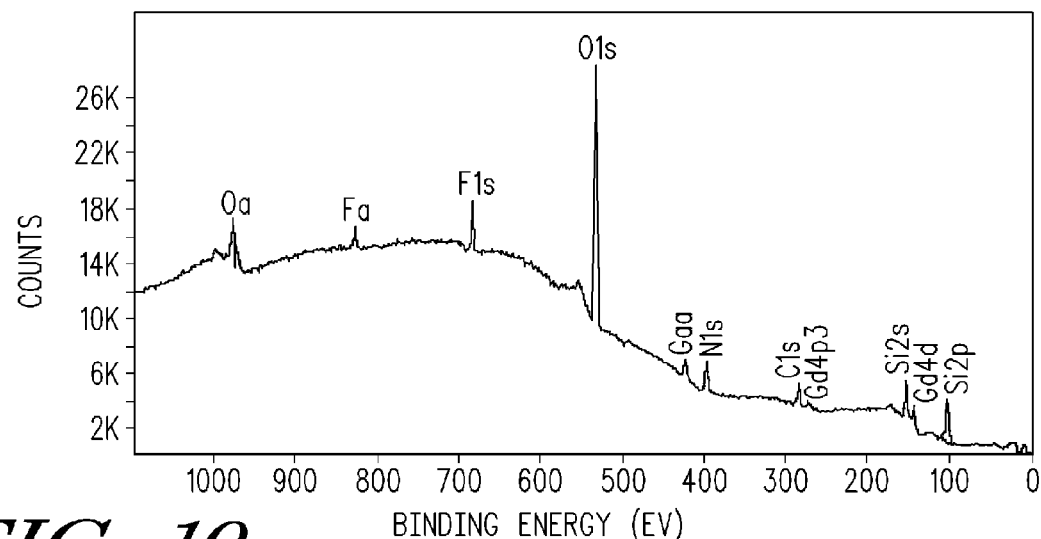
Figure 11:
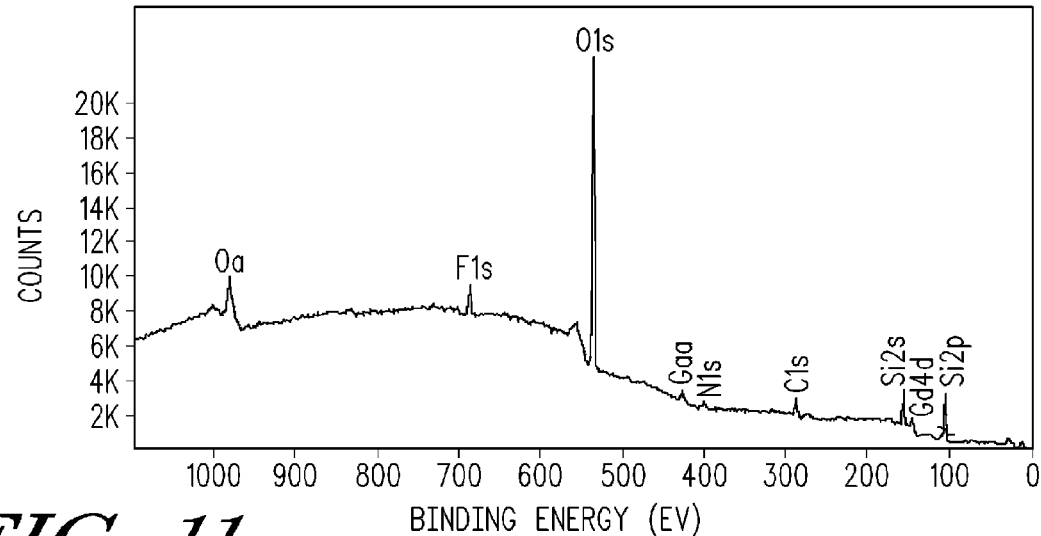

In the foregoing, a structure and process for improved insulated gate field-effect transistor using gallate gate dielectric has been described. FIGS. 9-11 are plots of X-ray Photoelectron Spectroscopy (XPS) data of gadolinium gallium oxide (GGO) surface passivation and gate dielectric layer 24 at various steps in the manufacturing process showing how various treatments according to embodiments of the present invention can reduce contamination in the oxide passivation and gate dielectric. In these Figures, the ordinate denotes photoelectron emission counts of excitations from the core levels of various atoms on the surface of GGO layer 24 including contaminants. Relative concentrations of the atoms may be derived. The abscissa denotes the binding energies of the excitations of the photo electrons for the particular elements on the surface. The technique is sensitive to the chemical state of the GGO surface and atomic concentrations of various elements.

FIG. 9 is a plot of the photoelectron emission counts due to $O^{1s}$, $C^{1s}$, $Ga^{3p}$, $Gd^{4d}$, and $F^{1s}$ at binding energies 531.16 eV, 284.596 eV, 105.046 eV, 142.834 eV and 684.462 eV from the surface of GGO layer 24 prior to deposition of low temperature nitride layer 28 and exposure to oxygen plasma 36. Concentration of these species are estimated respectively as: $O^{1s}$ 28.8%, $C^{1s}$ 20.97%, $Ga^{3p}$ 8.49%, $Gd^{4d}$ 7.45%, and $F^{1s}$ 34.22%. FIG. 10 shows the photoelectron emission counts after deposition of low temperature nitride layer 28. It will be noted that the surface concentration of carbon (10.607%) and fluorine (5.847%) are much reduced compared to those observed in FIG. 9. Peaks due to $Si^{2p}$, $N^{1s}$, and $Gd^{4p3}$, as well as $F^{1s}$, $O^{1s}$, and $C^{1s}$ are dominant. FIG. 11 shows the photoelectron emission spectra of the GGO surface after low temperature deposition of nitride layer 28 and exposure to inductively coupled oxygen plasma 36. The levels of carbon (9.57%) and fluorine (4.383%) contaminants are further reduced compared to those observed in FIG. 9. In addition, the level of free gadolinium is lower, as indicated by the low concentration (0.682%) of $Gd^{4p}$, which results in decreased traps in GGO layer 24.

Insulated gate field affect transistors formed as described above maintain low sheet resistance (<600 ohms/sq) thereby providing low ON resistance, and exhibit high III-V MOSFET performance. The benefit of reduced contamination and trap forming free Gd and Ga is attested in the XPS data analysis in FIGS. 9 through 11 for various stages of wafer processing. This is believed to result from providing silicon nitride containing layer 28, 28' on the surface of GGO layer 24 in manufacturing stage 102 for layer 28 and 104 for layer 28', and exposing nitride containing layer 28, 28' to oxygen plasma 36 in manufacturing stage 104.

According to a first embodiment, there is provided a method for forming an insulated gate field effect device (60), comprising, providing a semiconductor substrate (20) having a first surface (201), epitaxially forming a semiconductor layer (22) over the first surface (201), forming a dielectric layer (24) over the semiconductor layer (22), covering the dielectric layer (24) with a first sealing layer (28, 28'), exposing the first sealing layer (28, 28') to an oxygen plasma (36), providing spaced-apart source-drain contacts 421, 422) on the semiconductor layer (22), and providing a gate electrode (482) on the dielectric layer (24) disposed between the spaced-apart source-drain contacts (421, 422). According to a further embodiment, the method comprises, after providing spaced-apart source-drain contacts (421,422), covering the first sealing layer (28, 28') with a second sealing layer (44). According to a still further embodiment, the dielectric layer (24) comprises one or more gallates. According to a yet further embodiment, the dielectric layer (24) includes a first layer (25) comprising gallium oxide and a second layer (26) comprising gadolinium-gallium oxide. According to a still yet further embodiment, the first sealing layer (28, 28') comprises a nitride. According to a yet still further embodiment, wherein the nitride comprises silicon nitride deposited at a temperature below about 200 degrees Celsius. According to another embodiment, the silicon nitride has a thickness in the range of about 20 to 100 nanometers. According to a still another embodiment, the nitride is deposited at a temperature below about 75 degrees Celsius. According to a yet another embodiment, the step of exposing the first sealing layer (28, 28') to an oxygen plasma (36), comprises exposing the first sealing layer to an RF oxygen plasma. According to a still yet another embodiment, the step of exposing the first sealing layer (28, 28') to an oxygen plasma (36), comprises exposing the first sealing layer to an inductively coupled oxygen plasma. According to a yet still another embodiment, the semiconductor layer (22) comprises GaAs, AlGaAs, InGaAs, or a combination thereof.

According to a second embodiment, there is provided an insulated gate field effect transistor (IGFET) (60), comprising, a substrate (20) comprising a semiconductor, a further semiconductor layer (22) on the substrate, adapted to contain the channel (230) of the IGFET (60), spaced-apart source-drain electrodes (421, 422) formed on the further semiconductor layer (22), a dielectric layer (24) formed on the further semiconductor layer (22), a nitride containing sealing layer (28, 28') formed on the dielectric layer (24) wherein the sealing layer (28, 28') has an increased oxygen concentration region (38) proximate an upper surface (282) of the sealing layer (28, 28'), and a gate electrode (482) formed on the dielectric layer (24). According to a further embodiment, the dielectric layer (24) comprises one or more gallates. According to a still further embodiment, the gallates comprise gallium oxide and gadolinium-gallium oxide. According to a yet further embodiment, the sealing layer (28, 28') comprises silicon nitride. According to a still yet further embodiment, the sealing layer (28, 28') has a thickness (281) in the range of about 20 to 200 nanometers. According to a yet still further embodiment, the silicon nitride is deposited at a temperature at or below about 150-200 degrees Celsius.

According to a third embodiment, there is provided a method for forming an insulated gate semiconductor device (60), comprising, providing a semiconductor (20, 22) having a first surface (226), forming a gallate containing dielectric (24) on the first surface (226), where the dielectric (24) has a second surface (241) spaced apart from the first surface (226), forming a nitride containing sealant layer (28, 28') on the second surface (241), wherein the sealant layer (28, 28') has an oxygen rich region (38) proximate a third surface (282) spaced apart from the second surface (241), etching an aperture (462) through the sealant layer (28, 28') to expose a gate portion (245) of the second surface (241), and depositing a gate conductor (482) on the gate portion (245) of the second surface (241) in the further aperture (462). According to a further embodiment, the method further comprises, prior to the step (107) of etching an aperture (462), forming a nitride containing further sealing layer (44) on the third surface (282), wherein the further sealing layer (44) is also etched during the step (107) of etching the aperture (462). According to a still further embodiment, the step (102, 10)) of forming a nitride containing sealant layer (28, 28') having an oxygen rich region (38) proximate the third surface (282), comprises forming a nitride containing layer (28, 28') on the second surface (241) with a third surface (282) spaced-apart from the second surface (241), and then exposing the third surface (282) to an oxygen plasma (36). According to a yet further embodiment, the gallate containing dielectric layer (24) comprises a GO-GGO stack. According to a still yet further embodiment, the nitride containing sealant layer (28, 28') is formed at or below a temperature of about 150 degrees Celsius. According to a yet still another embodiment, the oxygen rich region (38) is formed using an oxygen plasma.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an insulated gate field effect device, comprising:
   providing a semiconductor substrate having a first surface;
   epitaxially forming a semiconductor layer on the first surface;
   forming a dielectric layer over the semiconductor layer;
   covering the dielectric layer with a first sealing layer;
   exposing the first sealing layer to an oxygen plasma to produce an oxygen rich layer in the first sealing layer;
   providing spaced-apart source-drain contacts on the semiconductor layer; and
   providing a gate electrode on the dielectric layer disposed between the spaced-apart source-drain contacts.

2. The method of claim 1, further comprising, after providing spaced-apart source-drain contacts, covering the first sealing layer with a second sealing layer.

3. The method of claim 1, wherein the dielectric layer comprises one or more gallates.

4. The method of claim 3, wherein the dielectric layer includes a first layer comprising gallium oxide and a second layer comprising gadolinium-gallium oxide.

5. The method of claim 1, wherein the first sealing layer comprises a nitride.

6. The method of claim 5, wherein the nitride comprises silicon nitride deposited at a temperature below about 200 degrees Celsius.

7. The method of claim 6, wherein the silicon nitride has a thickness in the range of about 20 to 100 nanometers.

8. The method of claim 6, wherein the nitride is deposited at a temperature below about 75 degrees Celsius.

9. The method of claim 1, wherein the step of exposing the first sealing layer to an oxygen plasma, comprises exposing the first sealing layer to an RF oxygen plasma.

10. The method of claim 1, wherein the step of exposing the first sealing layer to an oxygen plasma, comprises exposing the first sealing layer to an inductively coupled oxygen plasma.

11. The method of claim 1, wherein the semiconductor layer comprises one or more materials selected from a group consisting of GaAs, AlAs/GaAs, AlGaAs, and InGaAs.

12. The method of claim 1, further comprising the steps, performed after covering the dielectric layer and before exposing the first sealing layer to the oxygen plasma, of:
   performing an oxygen implant to form insulating regions in the semiconductor substrate; and
   removing and re-depositing the dielectric layer.

13. The method of claim 1, wherein the semiconductor substrate comprises GaAs.

14. The method of claim 1, wherein the first sealing layer comprises a further dielectric layer.

15. The method of claim 1, wherein the oxygen rich layer is located between a top surface and a bottom surface of the first sealing layer.

16. The method of claim 15, wherein the oxygen rich layer is spaced apart from the bottom surface of the first sealing layer.

* * * * *